US007193875B2

(12) United States Patent
Kim

(10) Patent No.: US 7,193,875 B2
(45) Date of Patent: Mar. 20, 2007

(54) CACHE HIT LOGIC OF CACHE MEMORY

(75) Inventor: Kwang-Il Kim, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 33 days.

(21) Appl. No.: 11/093,869

(22) Filed: Mar. 30, 2005

(65) Prior Publication Data

US 2005/0265061 A1 Dec. 1, 2005

(30) Foreign Application Priority Data

May 28, 2004 (KR) ..................... 10-2004-0038331

(51) Int. Cl.
*G11C 15/00* (2006.01)

(52) U.S. Cl. ............. 365/49; 365/189.07; 365/189.05; 365/185.2; 365/189.11

(58) Field of Classification Search ................. 365/49, 365/189.07, 189.05, 185.2, 189.11
See application file for complete search history.

(56) References Cited

U.S. PATENT DOCUMENTS 4,959,835 A 9/1990 Yosida et al. ............. 371/51.1
5,289,403 A 2/1994 Yetter ......................... 365/49
5,611,072 A 3/1997 Tran .......................... 395/463
5,936,892 A * 8/1999 Wendell ............... 365/189.03
6,122,710 A 9/2000 Kumar et al. .............. 711/118
6,418,066 B1 * 7/2002 Hidaka ....................... 365/198
7,016,229 B2 * 3/2006 Kim ..................... 365/185.17
2003/0161194 A1 * 8/2003 Ma et al. .................... 365/200
2004/0114411 A1 * 6/2004 Noda et al. .................. 365/49
2005/0195662 A1 * 9/2005 Ooishi .................. 365/189.05

FOREIGN PATENT DOCUMENTS

KR 99-72597 9/1999
KR 04-14741 2/2004

* cited by examiner

*Primary Examiner*—Tuan T. Nguyen
(74) *Attorney, Agent, or Firm*—Mills & Onello LLP

(57) ABSTRACT

A cache hit logic for determining whether data required by a processor is stored in a cache memory includes a dummy cell string that operates the same as a sense amplifier for sensing a tag address stored in a tag memory cell array and a comparison logic for determining whether the sensed tag address coincides with an input tag address, a dummy sense amplifier, and a dummy comparison logic. The cache hit logic improves the reliability of a hit signal and operation speed is not limited.

31 Claims, 7 Drawing Sheets

CACHE HIT LOGIC OF CACHE MEMORY

CROSS-REFERENCE TO RELATED APPLICATIONS

This U.S. non-provisional patent application claims priority under 35 U.S.C. § 119 of Korean Patent Application 2004-38331 filed on May 28, 2004, the entire contents of which are hereby incorporated by reference.

BACKGROUND OF THE INVENTION

The present invention relates to a cache memory, and more particularly, to a cache hit logic for determining whether a tag address stored in a tag memory coincides with an input tag address.

When various typical programs are analyzed, it is noted that reference of a memory for a given time tends to be performed only in a limited region. Such a phenomenon is referred to as locality of reference and is readily understood from the fact that typical computer programs use various program roofs and sub-routines and sequentially proceed. Also, reference of a memory of data tends to be limited to a region. A table-lookup process and a repeated process of referring to a common memory and arrangement correspond to the typical computer programs.

When the programs and data that are frequently referred to are stored in a small memory having high speed, average memory access time is reduced. Therefore, the total time required for executing programs is reduced. Such a small memory having high speed is referred to as a cache memory. According to recent technology, the cache memory is integrated with a single chip together with a processor.

The basic operation of the cache memory is in accordance with the following. When it is necessary for the processor to access the memory, the cache is first investigated. When desired words are found in the cache, the words are read. When desired words are not found, the main memory is accessed in order to read words. The block that includes the words is transmitted from the main memory to the cache memory. The size of the block is about 1 to 16 words.

The performance of a cache memory is measured by a hit ratio. When a processor refers to a memory, if desired data is found in a cache, it is referred to as hit. If the desired data is not found in the cache and is found in a main memory, it is referred to as miss. The ratio obtained by dividing the number of hits by the total number of references of a memory performed by the processor is referred to as hit ratio. The hit ratio is experimentally measured by performing typical programs of a computer to count the number of hits and the number of misses for a given time. In general, the hit ratio is no less than 0.9, which verifies the locality of reference of a memory.

A cache hit logic is a circuit for determining whether data required by a processor is stored in a cache memory and is provided in the cache memory. FIG. 1 illustrates a typical cache hit logic. FIG. 2 is a timing diagram of signals used for the cache hit logic illustrated in FIG. 1.

Referring to FIG. 1, a cache hit logic 100 includes a tag memory cell array 110, a row decoder 120, a column decoder 130, a sense amplifier and a latch circuit 140, a comparison logic 150, and an output circuit 160.

The comparison logic 150 includes XNOR gates 151 to 154 for determining whether a tag address TAGOUT<n:0> sensed and latched by the sense amplifier and the latch circuit 140 coincides with a tag address TAGADD<n:0> input from a processor (not shown). The XNOR gates 151 to 154 correspond to the bits of the tag address TAGOUT<n:0> and the bits of the tag address TAGADD<n:0>, respectively. The XNOR gates 151 to 154 output logic '1', that is, high level comparison signals X<n:0> when the input tag address bits coincide with each other.

The output circuit 160 includes AND gates 161 to 166 for outputting a high level hit signal HIT when the comparison signals X<n:0> from the XNOR gates 151 to 154 are at a high level.

However, since the output circuit 160 of the cache hit logic 100 illustrated in FIG. 1 includes AND gates of various stages, it takes a relatively long time to output the final hit signal HIT. Therefore, it is difficult to realize a high-speed cache hit logic.

FIG. 3 illustrates another circuit of a conventional cache hit logic. Referring to FIG. 3, an output circuit 360 of a cache hit logic 300 includes a PMOS pre-charge transistor 370, NMOS transistors 371 to 378, and a latch 361. The gate of the pre-charge transistor 370 and the gates of the transistors 375 to 378 are connected to a clock signal CLK. When the clock signal CLK is at a low level, a node N1 is pre-charged to a source voltage level by the pre-charge transistor 370.

When the clock signal CLK is transitioned to the high level, the pre-charge transistor 370 is turned off and the NMOS transistors 375 to 378 are turned on. At this time, comparison signals Y<n:0> output from XOR gates 351 to 354 of a comparison logic 350 turn on or turn off the NMOS transistors 371 to 374.

When the tag address TAGOUT<n:0> sensed by a tag memory cell array 310 coincides with the input tag address TAGADD<n:0>, the comparison signals Y<n:0> are at the low level. Therefore, the NMOS transistors 371 to 374 are turned off such that the first node N1 is maintained at the pre-charge level. As a result, a low level hit signal nHIT is output through the latch 361.

If even one bit between the tag address TAGOUT<n:0> sensed by the tag memory cell array 310 and the input tag address TAGADD<n:0> is not the same, a comparison signal corresponding to the bit that discords is at the high level. When even one among the NMOS transistors 371 to 374 is turned on, the first node N1 is discharged. As a result, the high level hit signal nHIT is output through the latch 361.

Delay of the output circuit 360 in the cache hit logic 300 illustrated in FIG. 3 is shorter than delay of the output circuit 160 in the cache hit logic 100 illustrated in FIG. 1. However, when the period of the clock signal CLK changes, it is not possible to guarantee the reliability of the hit signal nHIT.

FIG. 4A illustrates a setup margin after the comparison signals Y<n:0> are output until the hit signal nHIT is output when a frequency F is 1/2T. If the period of the clock signal CLK is properly controlled when the cache control logic 300 is designed, it is possible to secure an optimal setup margin.

However, when it takes long to sense the tag address TAGOUT<n:0> from the tag memory cell array 310 in a state where the period of the clock signal CLK is determined, the hit signal nHIT may be output at an undesired level. Also, when the period of the clock signal CLK is short, it is not possible to secure a setup margin such that the hit signal nHIT may be output at an undesired level.

On the other hand, as illustrated in FIG. 4B, when the period of the clock signal CLK is set long (F=1/T) in order to synchronize the cache memory with peripheral circuits, the setup margin is long. However, the operation speed of the cache hit logic 300 is reduced, which operates as a limitation on designing a high-speed cache memory and processor.

SUMMARY OF THE INVENTION

In order to solve the above-described problems, it is an object of the present invention to provide a cache hit logic capable of increasing speed of determining cache hits.

It is another object of the present invention to provide a cache hit logic capable of increasing speed of determining cache hits while guaranteeing reliability in determining cache hits.

According to an aspect of the present invention, a cache memory comprises a tag memory cell array arranged in rows and columns to store a tag address, a row decoder for selecting the rows, a column decoder for selecting the columns, a sense amplifier for sensing a tag address stored in a cell of the tag memory cell array selected by the row decoder and the column decoder in response to activation of an enable signal, and a comparison circuit for comparing the sensed tag address with an input tag address when a time required for the sense amplifier to sense the tag address has passed after the enable signal is activated to output a hit signal corresponding to the comparison result.

According to one embodiment, the comparison circuit activates an output enable signal when a time required for the sense amplifier to sense the tag address has passed after the enable signal is activated.

The comparison circuit can include a dummy cell string arranged in a line in the column direction, a dummy sense amplifier for sensing a pair of complementary dummy addresses stored in a cell of the dummy cell string selected by the row decoder in response to the enable signal, and a logic circuit for activating the output enable signal when the pair of complementary dummy addresses are output from the dummy sense amplifier.

The dummy cell string can be a static random access memory (SRAM) cell string.

The comparison circuit can further comprise a logic circuit for comparing the sensed tag address with the input tag address to output a comparison signal.

The comparison circuit can further comprise a pre-charge transistor controlled by the output enable signal to pre-charge a first node, a first transistor having a drain connected to the first node, a source, and a gate controlled by a comparison signal from the logic circuit, a second transistor having a drain connected to the source of the first transistor, a source connected to a ground voltage, and a gate connected to the output enable signal, and a latch circuit for latching the signal level of the first node.

A plurality of cells of the tag memory cell array can be selected by the row decoder and the column decoder in response to the activation of the enable signal.

In one embodiment, the sense amplifier senses tag address bits stored in the plurality of cells selected by the row decoder and the column decoder in response to the activation of the enable signal.

In one embodiment, the logic circuit compares the sensed tag address bits with a plurality of input tag address bits to output a plurality of comparison signals corresponding to the comparison results of the respective bits.

In one embodiment, the comparison circuit further comprises a pre-charge transistor controlled by the output enable signal to pre-charge a first node, a first transistor array having a drain connected to the first node, a source, and a gate controlled by a corresponding comparison signal from the logic circuit, a second transistor array having a drain connected to the source of the corresponding transistor of the first transistor array, a source connected to a ground voltage, and a gate connected to the output enable signal, and a latch circuit for latching the signal level of the first node.

In one embodiment, the latch circuit comprises a PMOS transistor having a source connected to a source voltage, a drain connected to the first node, and a gate and an inverter having an input port connected to the first node and an output port connected to the gate of the PMOS transistor. A signal output from the output port of the inverter is the hit signal.

According to another aspect of the present invention, a cache memory comprises a tag memory cell array arranged in rows and columns to store a tag address, a row decoder for selecting the rows, a column decoder for selecting the columns, a sense amplifier for sensing a tag address stored in a cell of the tag memory cell array selected by the row decoder and the column decoder in response to activation of an enable signal, a comparison logic for comparing the sensed tag address with an input tag address to output a comparison signal, a dummy cell string arranged in the column direction of the tag memory cell array, a dummy sense amplifier for sensing a dummy address stored in a dummy cell selected by the row decoder in response to the activation of the enable signal, and an output circuit for outputting the comparison signal from the comparison logic as a hit signal when the dummy sense amplifier senses the dummy address.

According to one embodiment, the dummy cell string is a SRAM cell string.

According to one embodiment, the dummy sense amplifier senses a pair of complementary dummy address bits.

According to one embodiment, the output circuit comprises a dummy comparison logic for comparing the pair of complementary dummy address bits sensed by the dummy sense amplifier with each other to output a dummy comparison signal and an output portion for outputting the comparison signal from the comparison logic as the hit signal in response to the dummy comparison signal.

In one embodiment, the output portion pre-charges a first node when the dummy comparison signal is at a first level and outputs the pre-charge level of the first node as the hit signal when the dummy comparison signal is at a second level and when the comparison signal from the comparison logic represents that the sensed tag address coincides with an input tag address.

According to one embodiment, the output portion discharges the first node when the dummy comparison signal is at a second level and when the comparison signal from the comparison logic represents that the sensed tag address does not coincide with an input tag address and outputs the discharge level of the first node as the hit signal.

In one embodiment, the comparison logic and the dummy comparison logic are composed of the same circuit.

According to another aspect, the invention is directed to a cache memory comprising a tag memory cell array arranged in rows and columns to store a tag address, a row decoder for selecting the rows, a column decoder for selecting the columns, a sense amplifier for sensing a tag address stored in a cell of the tag memory cell array selected by the row decoder and the column decoder in response to activation of an enable signal, a comparison logic for comparing the sensed tag address with an input tag address to output a comparison signal, a dummy sense amplifier for receiving a source voltage and a ground voltage to output a pair of complementary dummy address signals in response to the activation of the enable signal, and an output circuit for outputting the comparison signal from the comparison logic as a hit signal when the dummy sense amplifier outputs the pair of complementary dummy address signals.

In one embodiment, the output circuit comprises a dummy comparison logic for comparing the pair of complementary dummy address bits output from the dummy sense amplifier with each other to output a dummy comparison signal and an output portion for outputting the comparison signal from the comparison logic as the hit signal in response to the dummy comparison signal.

In one embodiment, the output portion pre-charges a first node when the dummy comparison signal is at a first level and outputs the pre-charge level of the first node as the hit signal when the dummy comparison signal is at a second level and when the comparison signal from the comparison logic represents that the sensed tag address coincides with an input tag address.

In one embodiment, the output portion discharges the first node when the dummy comparison signal is at a second level and when the comparison signal from the comparison logic represents that the sensed tag address does not coincide with an input tag address and outputs the discharge level of the first node as the hit signal.

In one embodiment, the comparison logic and the dummy comparison logic are composed of the same circuit.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENT

Figure 5:
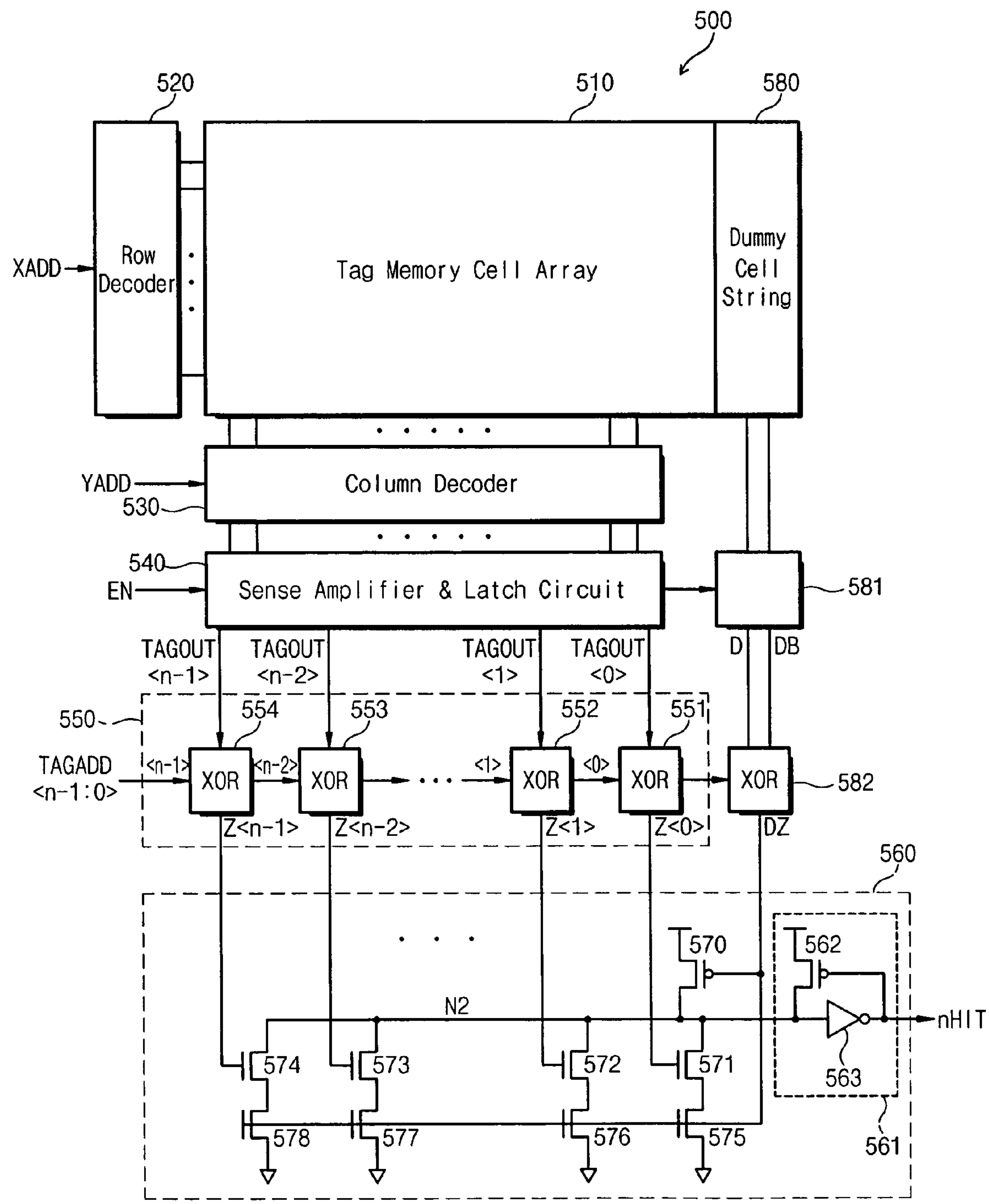
FIG. 5 illustrates a cache hit logic according to an embodiment of the present invention.

FIG. 5 illustrates a cache hit logic 500 according to an embodiment of the present invention. The cache hit logic 500 includes a tag memory cell array 510, a row decoder 520, a column decoder 530, a sense amplifier and latch circuit 540, a comparison logic 550, an output circuit 560, a dummy cell string 580, a dummy sense amplifier 581, and a dummy comparison logic 582.

The tag memory cell array 510 includes a plurality of memory cells arranged in rows and columns. The dummy cell string 580 includes dummy memory cells arranged in a line in the column direction of the tag memory cell array 510. In one embodiment, each of the tag memory cell array 510 and the dummy cell string 580 includes a static random access memory (SRAM) cells.

The row decoder 520 selects a row among the rows of the tag memory cell array 510 in response to a row address XADD and a row among the rows of the dummy cell string 580. The column decoder 530 selects n (n is a positive integer equal to or larger than 1) columns among the columns of the tag memory cell array 510 in response to a column address YADD. For example, when the tag memory cell array 510 includes n columns and each of the n columns is connected to 4 sub-columns, a total of n sub columns are selected one by one among the 4 sub-columns connected to each of the n columns by a 2 bit column address YADD<1:0>. That is, the tag memory cell array 510 includes n*4 columns and n columns are selected by the 2 bit column address YADD<1:0>.

The sense amplifier and latch circuit 540 senses and latches a row selected by the row decoder 520 and n bit tag addresses TAGOUT<n-1:0> connected to n columns selected by the column decoder 530 in response to the activation of an enable signal EN.

The comparison logic 550 includes n XOR gates 551 to 554 corresponding to the bits of the tag address TAGOUT<n-1:0>. The XOR gates 551 to 554 receive the corresponding bit of the tag address TAGOUT<n-1:0> from the sense amplifier and latch circuit 540 and the corresponding bit of an input tag address TAGADD<n-1:0> to compare the corresponding bit of the tag address TAGOUT<n-1:0> with the corresponding bit of the tag address TAGADD<n-1:0>. The XOR gates 551 to 554 output a logic '0', that is, low level comparison signal when the two input bits coincide with each other and output a logic '1', that is, high level comparison signal when the two input bits do not coincide with each other. Comparison signals Z<n-1:0> output from the comparison logic 550 are provided to the output circuit 560.

On the other hand, the address stored in the dummy cell of the dummy cell string 580 selected by the row decoder 520 is provided to the dummy sense amplifier 581. As noted above, the dummy cell string 580 is composed of an SRAM cell string. As is well known, an SRAM senses data stored in a cell through a pair of complementary signal lines BL and /BL. The dummy sense amplifier 581 provides a pair of complementary address bits D and DB sensed in response to the activation of the enable signal EN to the dummy comparison logic 582. The dummy sense amplifier 581 sets the pair of address bits D and DB at the low level, when the enable signal EN is deactivated.

The dummy comparison logic 582 is composed of XOR gates like the comparison logic 550. Since the pair of address bits D and DB from the dummy sense amplifier 581 always have complementary values, the dummy comparison logic 582 outputs a high level dummy comparison signal DZ when the pair of address bits D and DB are input from the dummy sense amplifier 581.

The output circuit 560 includes a PMOS transistor 570 that acts as a pre-charge transistor, NMOS transistors 571 to 578, and a latch 561. The pre-charge transistor 570 has a source connected to a source voltage, a drain connected to a node N2, and a gate connected to the dummy comparison signal DZ. The first transistors 571 to 574 correspond to the XOR gates 551 to 554 of the comparison logic 550, respectively. Each of the first transistors 571 to 574 has a drain connected to the node N2, a source, and a gate connected to a comparison signal from the corresponding XOR gate. The second transistors 575 to 578 correspond to the first transistors 571 to 574, respectively. Each of the second transistors 575 to 578 has a drain connected to the source of the corresponding first transistor, a source connected to a ground voltage, and a gate connected to the dummy comparison signal DZ from the dummy comparison logic 582. The latch 561 includes a PMOS transistor 562 and an inverter 563.

Since the dummy comparison signal DZ from the dummy comparison logic 582 is at the low level while the enable signal EN is deactivated, the node N2 is pre-charged to a source voltage level by the pre-charge transistor 570.

The row address XADD, the column address YADD, and the tag address TAGADD<n-1:0> are input and the enable signal EN is activated, the sense amplifier and latch circuit 540 senses and latches the tag address TAGOUT<n-1:0> stored in the tag memory cell array 510. At the same time, the dummy sense amplifier 581 outputs the pair of complementary dummy address bits D and DB in response to the activation of the enable signal EN.

The comparison logic 550 compares the sensed tag address TAGOUT<n-1:0> with the input tag address TAGADD<n-1:0> to output the comparison signals Z<n-1; 0>. The dummy comparison logic 582 outputs the high level dummy comparison signal DZ.

The pre-charge transistor 570 is turned off and the second transistors 575 to 578 are turned on by the high level dummy comparison signal DZ. Therefore, the node N2 is maintained at the pre-charged level or is discharged in accordance with the comparison signals Z<n-1:0> from the XOR gates 551 to 554. When the sensed tag address TAGOUT<n-1:0> completely coincides with the input tag address TAGADD<n-1:0>, the comparison signals Z<n-1:0> are at the low level such that the node N2 is maintained at the pre-charged level. When one or more bits discord between the sensed tag address TAGOUT<n-1:0> and the input tag address TAGADD<n-1:0>, the node N2 is discharged through the transistors corresponding to the bits that discord among the first transistors 571 to 574. The voltage level of the node N2 is output through the latch 561 as the hit signal nHIT.

Figure 6:
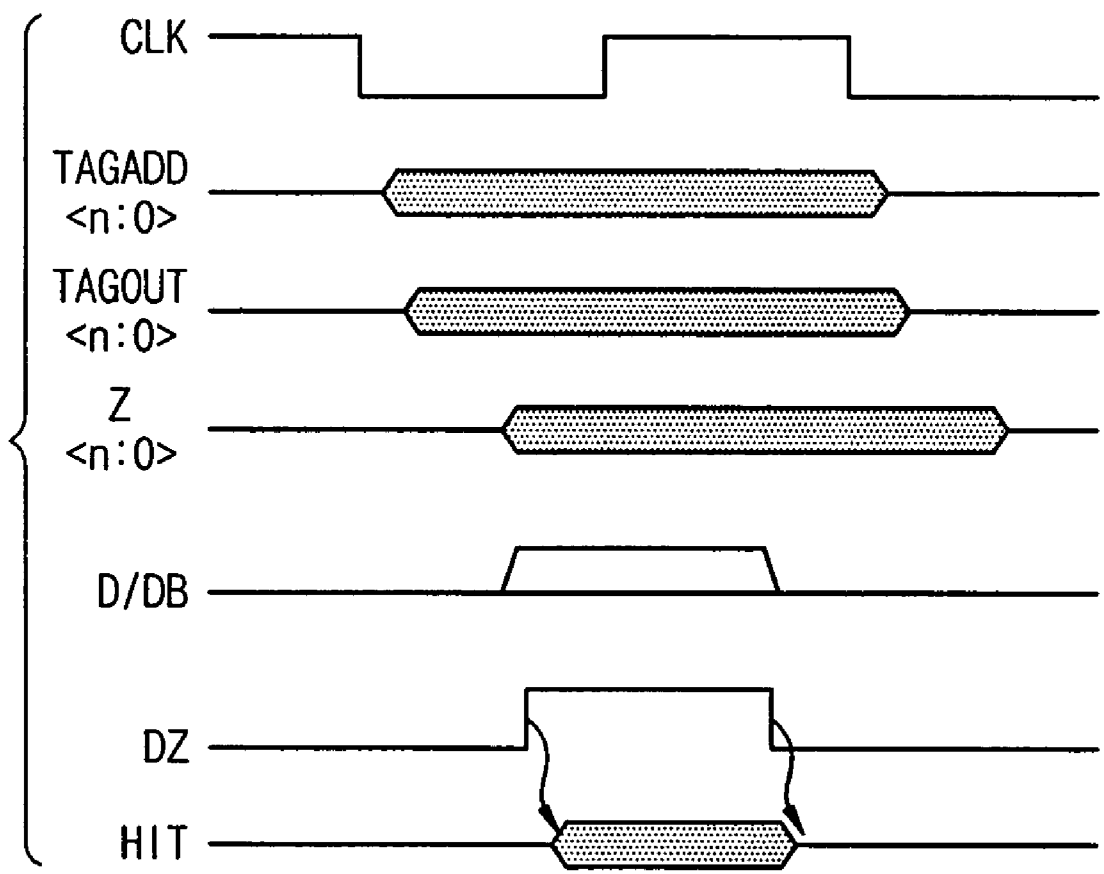
FIG. 6 is a timing diagram of signals used by the cache hit logic illustrated in FIG. 5.

Since the sense amplifier 540 and the dummy sense amplifier 581 simultaneously operate in response to the enable signal EN and the comparison logic 550 and the dummy comparison logic 582 simultaneously perform a comparison operation, the point of time at which the hit signal nHIT is output is dependent on the point of time of the sense operation of the sense amplifier 540 and the point of time of the comparison operation of the comparison logic 550. Therefore, the cache hit logic 500 according to the present invention can minimize the delay of time caused by the output circuit 560 as illustrated in FIG. 6.

Figure 1:
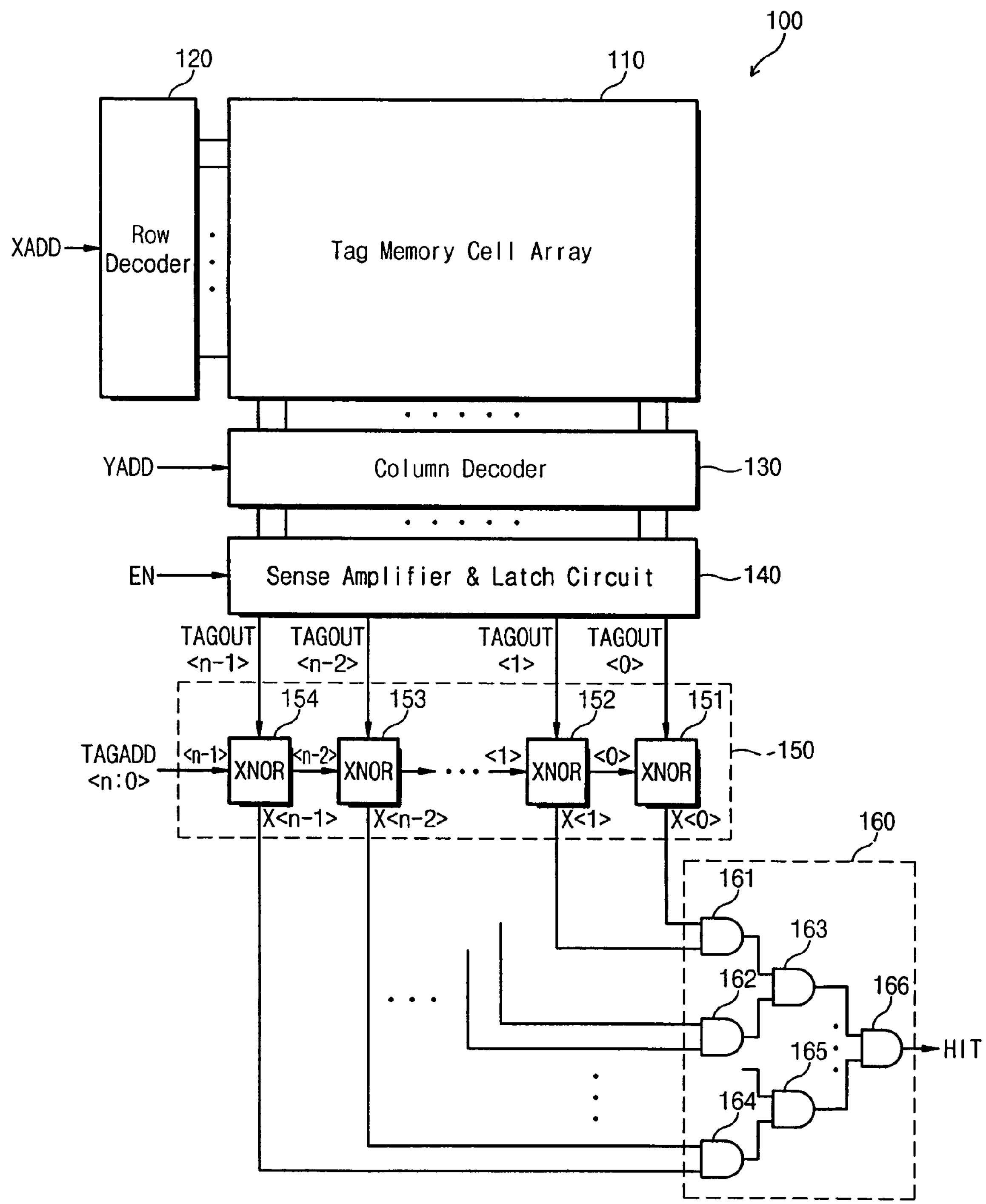
FIG. 1 illustrates a conventional cache hit logic.
Figure 2:
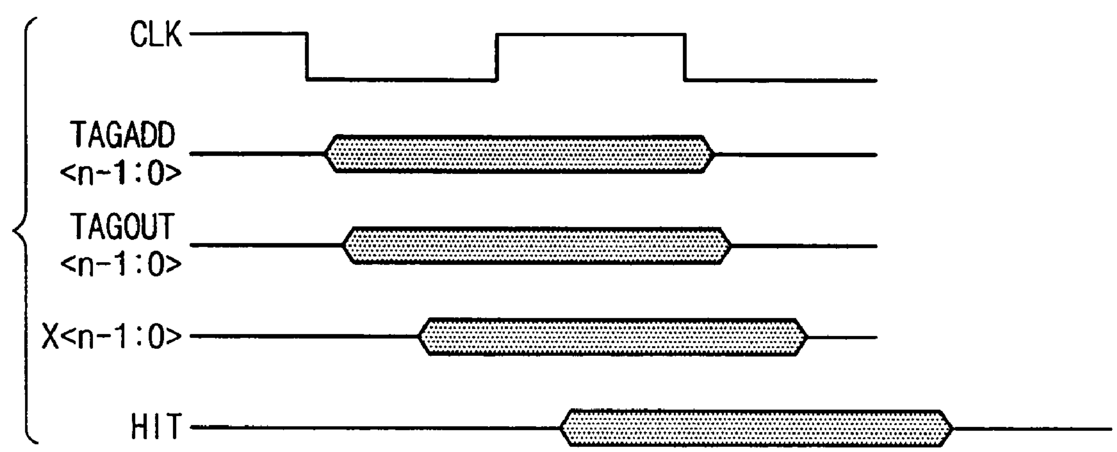
FIG. 2 is a timing diagram of signals used by the cache hit logic illustrated in FIG. 1.
Figure 3:
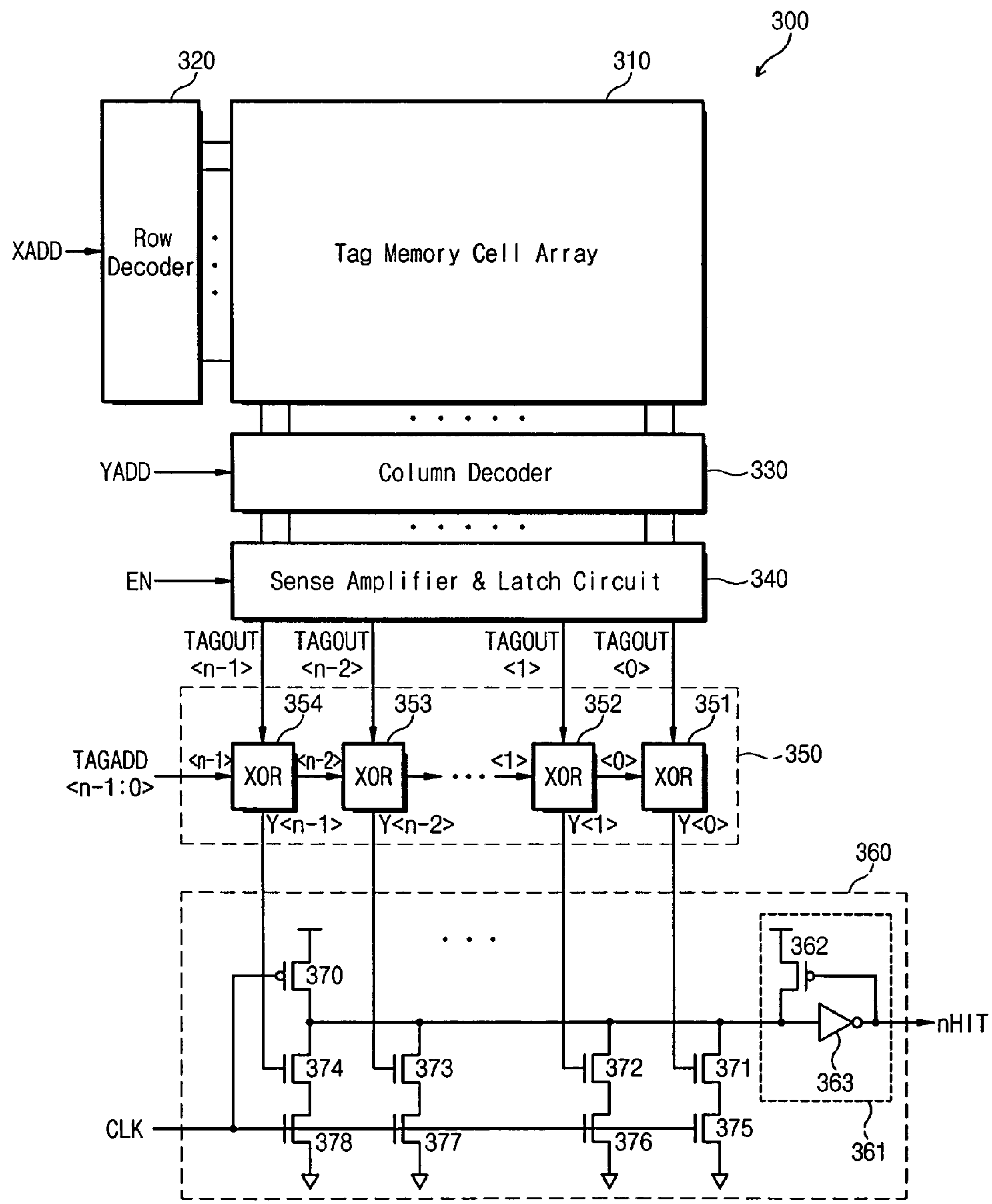
FIG. 3 illustrates another circuit of a conventional cache hit logic.
Figure 4A:
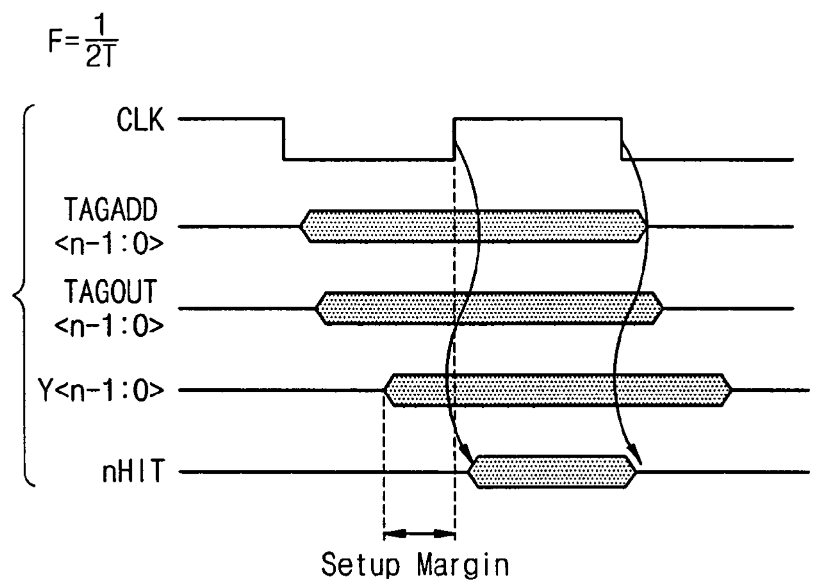
FIG. 4A illustrates a setup margin after comparison signals are output until a hit signal nHIT is output when a frequency F is 1/2T.
Figure 4B:
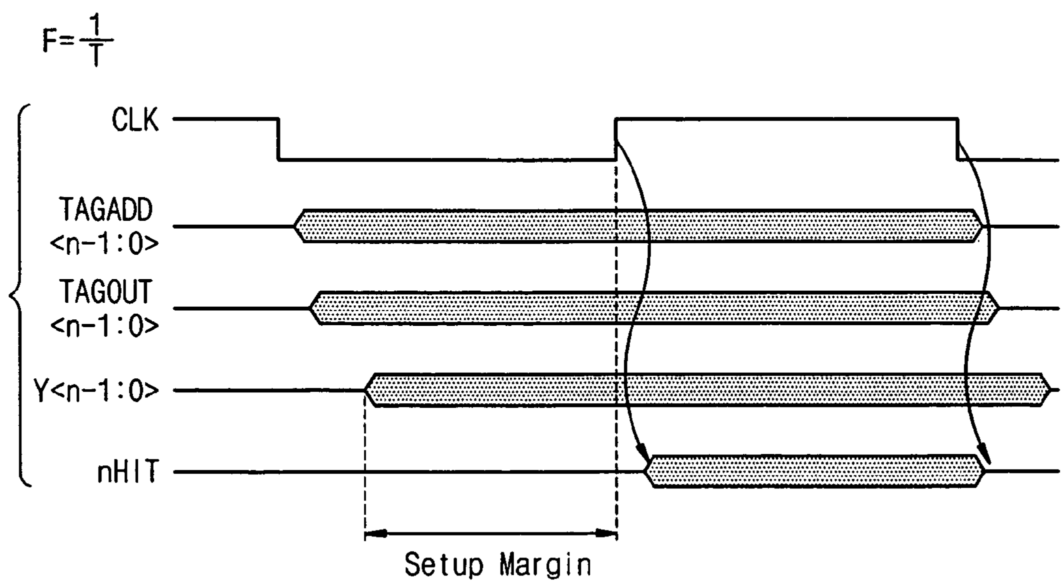
FIG. 4B illustrates a setup margin after the comparison signals are output until the hit signal nHIT is output when the frequency F is 1/T.

According to the conventional cache hit logic 300 illustrated in FIG. 3, the reliability of the hit signal nHIT cannot be guaranteed or there is a limitation on the operation speed in accordance with the relationship between the point of time at which the comparison signals Y<n-1:0> are output from the comparison logic 350 and the period of the clock signal CLK.

The cache hit logic 500 according to the invention includes the dummy cell string 580, the dummy sense amplifier 581, and the dummy comparison logic 582 in order to turn on the second transistors 575 to 578. Since the operation speed of the dummy sense amplifier 540 and the dummy comparison logic 582 is equal to the operation speed of the sense amplifier and latch circuit 540 and the comparison logic 550, the reliability of the hit signal nHIT is guaranteed and the operation speed is not limited.

Figure 7:
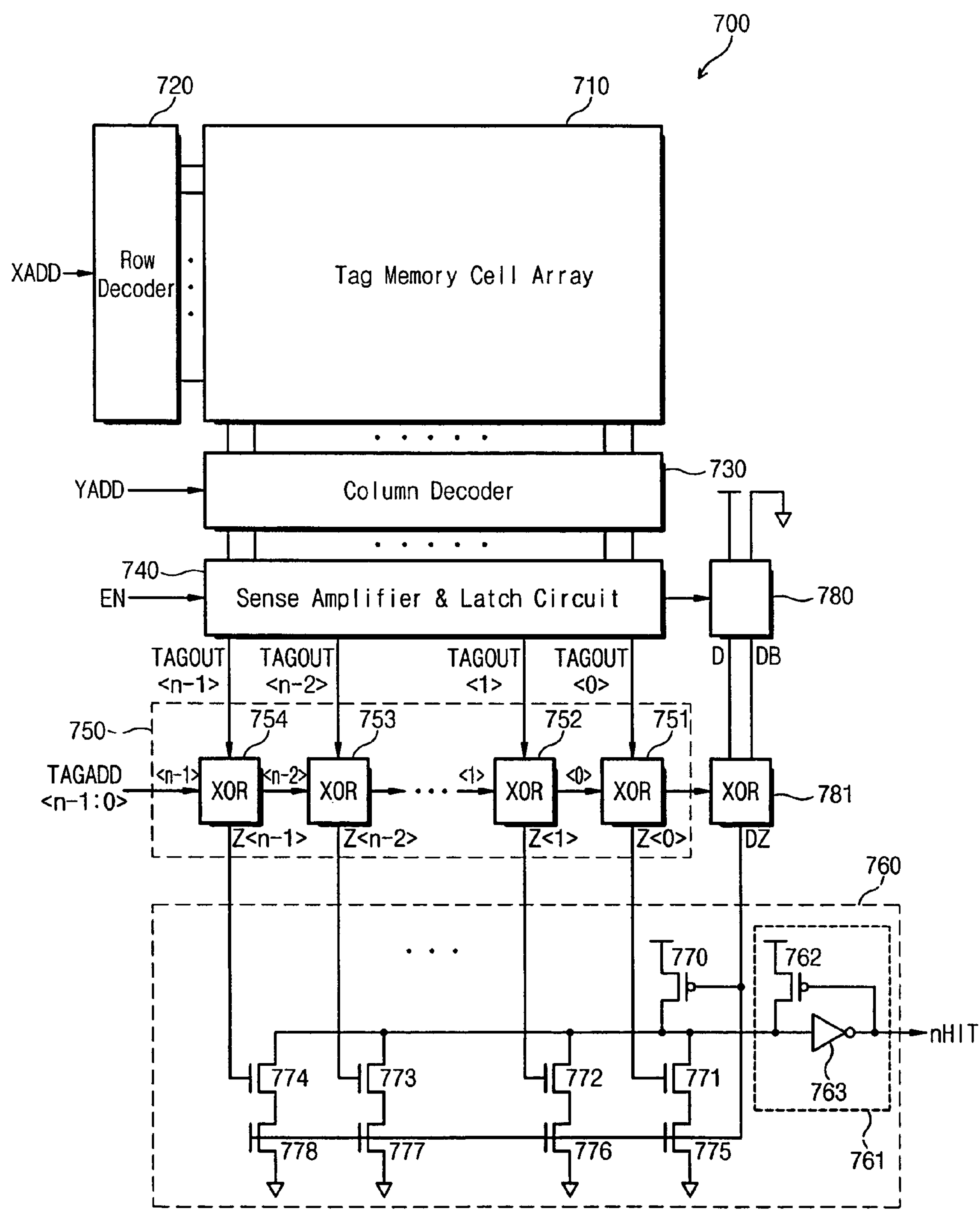
FIG. 7 illustrates a cache hit logic according to another embodiment of the present invention.

FIG. 7 illustrates a cache hit logic according to another embodiment of the present invention. Unlike the cache hit logic 500 illustrated in FIG. 5 which includes the dummy cell string 580, the cache hit logic 700 illustrated in FIG. 7 does not include a dummy cell string, and the source voltage and the ground voltage are connected to the two input ports of the sense amplifier 780, respectively. The sense amplifier 780 senses the source voltage and the ground voltage when the enable signal EN is activated to output a pair of complementary signals, that is, the dummy address bits D and DB. The structures and operations of the remaining circuits of the cache hit logic 700 are the same as the structures and operations of the remaining circuits of the cache hit logic 500. Therefore, description thereof will not be repeated.

According to the cache hit logic 700 illustrated in FIG. 7, the sense amplifier and the latch circuit 740 starts the operation of sensing the tag address TAGOUT<n-1:0> stored in the tag memory cell array 710 in response to the activation of the enable signal EN and, at the same time, outputs the dummy address bits D and DB. Therefore, according to the cache hit logic 700, the reliability of the hit signal nHIT is guaranteed and the operation speed is not limited.

As described above, according to the present invention, the speed at which the cache hit logic determines cache hits and reliability in determining the cache hits are improved.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. A cache memory comprising:

a tag memory cell array arranged in rows and columns to store a tag address;

a row decoder for selecting the rows;

a column decoder for selecting the columns;

a sense amplifier for sensing a tag address stored in a cell of the tag memory cell array selected by the row decoder and the column decoder in response to activation of an enable signal; and a comparison circuit for comparing the sensed tag address with an input tag address when a time required for the sense amplifier to sense the tag address has passed after the enable signal is activated to output a hit signal corresponding to the comparison result, wherein the comparison circuit activates an output enable signal when a time required for the sense amplifier to sense the tag address has passed after the enable signal is activated.

2. The cache memory as set forth in claim 1, wherein the comparison circuit comprises:

a dummy cell string arranged in a line in the column direction;

a dummy sense amplifier for sensing a dummy address stored in a cell of the dummy cell string selected by the row decoder in response to the enable signal; and a logic circuit for activating the output enable signal when pair of complementary dummy address bits are output from the dummy sense amplifier.

3. The cache memory as set forth in claim 2, wherein the dummy cell string is a static random access memory (SRAM) cell string.

4. The cache memory as set forth in claim 2, wherein the comparison circuit further comprises a logic circuit for comparing the sensed tag address with the input tag address to output a comparison signal.

5. The cache memory as set forth in claim 4, wherein the comparison circuit further comprises:

a pre-charge transistor controlled by the output enable signal to pre-charge a first node;

a first transistor having a drain connected to the first node, a source, and a gate controlled by the comparison signal from the logic circuit;

a second transistor having a drain connected to the source of the first transistor, a source connected to a ground voltage, and a gate connected to the output enable signal; and a latch circuit for latching the signal level of the first node.

6. The cache memory as set forth in claim 4, wherein a plurality of cells of the tag memory cell array are selected by the row decoder and the column decoder in response to the activation of the enable signal.

7. The cache memory as set forth in claim 6, wherein the sense amplifier senses tag address bits stored in the plurality of cells selected by the row decoder and the column decoder in response to the activation of the enable signal.

8. The cache memory as set forth in claim 7, wherein the logic circuit compares the sensed tag address bits with a plurality of input tag address bits to output a plurality of comparison signals corresponding to the comparison results of the respective bits.

9. The cache memory as set forth in claim 8, wherein the comparison circuit further comprises:

a pre-charge transistor controlled by the output enable signal to pre-charge a first node;

a first transistor array, each transistor in the first transistor array having a drain connected to the first node, a source, and a gate controlled by a corresponding comparison signal from the logic circuit;

a second transistor array, each transistor in the second transistor array having a drain connected to the source of the corresponding transistor of the first transistor array, a source connected to a ground voltage, and a gate connected to the output enable signal; and a latch circuit for latching the signal level of the first node.

10. The cache memory as set forth in claim 9, wherein the latch circuit comprises:

a PMOS transistor having a source connected to a source voltage, a drain connected to the first node, and a gate; and an inverter having an input port connected to the first node and an output port connected to the gate of the PMOS transistor, and wherein a signal output from the output port of the inverter is the hit signal.

11. A cache memory comprising:

a tag memory cell array arranged in rows and columns to store a tag address;

a row decoder for selecting the rows;

a column decoder for selecting the columns;

a sense amplifier for sensing a tag address stored in a cell of the tag memory cell array selected by the row decoder and the column decoder in response to activation of an enable signal;

a comparison logic for comparing the sensed tag address with an input tag address to output a comparison signal;

a dummy cell string arranged in the column direction of the tag memory cell array;

a dummy sense amplifier for sensing a dummy address stored in a dummy cell selected by the row decoder in response to the activation of the enable signal; and an output circuit for outputting the comparison signal from the comparison logic as a hit signal when the dummy sense amplifier senses the dummy address.

12. The cache memory as set forth in claim 11, wherein the dummy cell string is a SRAM cell string.

13. The cache memory as set forth in claim 12, wherein the dummy sense amplifier senses a pair of complementary dummy address bits.

14. The cache memory as set forth in claim 13, wherein the output circuit comprises:

a dummy comparison logic for comparing the pair of complementary dummy address bits sensed by the dummy sense amplifier with each other to output a dummy comparison signal; and an output portion for outputting the comparison signal from the comparison logic as the hit signal in response to the dummy comparison signal.

15. The cache memory as set forth in claim 14, wherein the output portion pre-charges a first node when the dummy comparison signal is at a first level and outputs the pre-charge level of the first node as the hit signal when the dummy comparison signal is at a second level and when the comparison signal from the comparison logic represents that the sensed tag address coincides with an input tag address.

16. The cache memory as set forth in claim 15, wherein the output portion discharges the first node when the dummy comparison signal is at a second level and when the comparison signal from the comparison logic represents that the sensed tag address does not coincide with an input tag address and outputs the discharge level of the first node as the hit signal.

17. The cache memory as set forth in claim 14, wherein the comparison logic and the dummy comparison logic are composed of the same circuit.

18. A cache memory comprising:

a tag memory cell array arranged in rows and columns to store a tag address;

a row decoder for selecting the rows;

a column decoder for selecting the columns; a sense amplifier for sensing a tag address stored in a cell of the tag memory cell array selected by the row decoder and the column decoder in response to activation of an enable signal;

a comparison logic for comparing the sensed tag address with an input tag address to output a comparison signal;

a dummy sense amplifier for receiving a source voltage and a ground voltage to output a pair of complementary dummy address bits in response to the activation of the enable signal; and an output circuit for outputting the comparison signal from the comparison logic as a hit signal when the dummy sense amplifier outputs the pair of complementary dummy address bits.

19. The cache memory as set forth in claim 18, wherein the output circuit comprises:

a dummy comparison logic for comparing the pair of complementary dummy address bits output from the dummy sense amplifier with each other to output a dummy comparison signal; and an output portion for outputting the comparison signal from the comparison logic as the hit signal in response to the dummy comparison signal.

20. The cache memory as set forth in claim 19, wherein the output portion pre-charges a first node when the dummy comparison signal is at a first level and outputs the pre-charge level of the first node as the hit signal when the dummy comparison signal is at a second level and when the comparison signal from the comparison logic represents that the sensed tag address coincides with an input tag address.

21. The cache memory as set forth in claim 20, wherein the output portion discharges the first node when the dummy comparison signal is at a second level and when the comparison signal from the comparison logic represents that the sensed tag address does not coincide with an input tag address and outputs the discharge level of the first node as the hit signal.

22. The cache memory as set forth in claim 21, wherein the comparison logic and the dummy comparison logic are composed of the same circuit.

23. A cache memory comprising:

a tag memory cell array arranged in rows and columns to store a tag address;

a row decoder for selecting the rows;

a column decoder for selecting the columns;

a sense amplifier for sensing a tag address stored in a cell of the tag memory cell array selected by the row decoder and the column decoder in response to activation of an enable signal; and a comparison circuit for comparing the sensed tag address with an input tag address when a time required for the sense amplifier to sense the tag address has passed after the enable signal is activated to output a hit signal corresponding to the comparison result, wherein the comparison circuit activates an output enable signal when a time required for the sense amplifier to sense the tag address has passed after the enable signal is activated, and wherein the comparison circuit comprises:

a dummy cell string arranged in a line in the column direction;

a dummy sense amplifier for sensing a dummy address stored in a cell of the dummy cell string selected by the row decoder in response to the enable signal; and a logic circuit for activating the output enable signal when a pair of complementary dummy addresses are output from the dummy sense amplifier.

24. The cache memory as set forth in claim 23, wherein the dummy cell string is a static random access memory (SRAM) cell string.

25. The cache memory as set forth in claim 23, wherein the comparison circuit further comprises a logic circuit for comparing the sensed tag address with the input tag address to output a comparison signal.

26. The cache memory as set forth in claim 25, wherein the comparison circuit further comprises:

a pre-charge transistor controlled by the output enable signal to pre-charge a first node;

a first transistor having a drain connected to the first node, a source, and a gate controlled by the comparison signal from the logic circuit;

a second transistor having a drain connected to the source of the first transistor, a source connected to a ground voltage, and a gate connected to the output enable signal; and a latch circuit for latching the signal level of the first node.

27. The cache memory as set forth in claim 25, wherein a plurality of cells of the tag memory cell array are selected by the row decoder and the column decoder in response to the activation of the enable signal.

28. The cache memory as set forth in claim 27, wherein the sense amplifier senses tag address bits stored in the plurality of cells selected by the row decoder and the column decoder in response to the activation of the enable signal.

29. The cache memory as set forth in claim 28, wherein the logic circuit compares the sensed tag address bits with a plurality of input tag address bits to output a plurality of comparison signals corresponding to the comparison results of the respective bits.

30. The cache memory as set forth in claim 29, wherein the comparison circuit further comprises:

a pre-charge transistor controlled by the output enable signal to pre-charge a first node;

a first transistor array, each transistor in the first transistor array having a drain connected to the first node, a source, and a gate controlled by a corresponding comparison signal from the logic circuit;

a second transistor array, each transistor in the second transistor array having a drain connected to the source of the corresponding transistor of the first transistor array, a source connected to a ground voltage, and a gate connected to the output enable signal; and a latch circuit for latching the signal level of the first node.

31. The cache memory as set forth in claim 30, wherein the latch circuit comprises:

a PMOS transistor having a source connected to a source voltage, a drain connected to the first node, and a gate; and an inverter having an input port connected to the first node and an output port connected to the gate of the PMOS transistor, and wherein a signal output from the output port of the inverter is the hit signal.

* * * * *